US006920624B2

(12) United States Patent
Garrepally et al.

(10) Patent No.: US 6,920,624 B2
(45) Date of Patent: Jul. 19, 2005

(54) METHODOLOGY OF CREATING AN OBJECT DATABASE FROM A GERBER FILE

(75) Inventors: Srinivas Garrepally, Singapore (MY); Sim ChingTong, Singapore (MY); Channasumudram Krishnamurthy Sowmithri, Singapore (MY); Manoj Kumar Dey, Singapore (MY)

(73) Assignee: Seagate Technology, LLC, Scotts Valley, CA (US)

( * ) Notice: Subject to any disclaimer, the term of this patent is extended or adjusted under 35 U.S.C. 154(b) by 0 days.

(21) Appl. No.: 10/186,228

(22) Filed: Jun. 28, 2002

(65) Prior Publication Data

US 2003/0135829 A1 Jul. 17, 2003

Related U.S. Application Data
(60) Provisional application No. 60/350,134, filed on Jan. 17, 2002.

(51) Int. Cl.$^7$ .................................................. G06F 9/45
(52) U.S. Cl. ............................... 716/8; 716/5; 716/11; 382/145; 345/418
(58) Field of Search ..................... 716/2, 5, 8, 11, 716/1, 3, 15; 345/418; 382/145, 147, 149

(56) References Cited

U.S. PATENT DOCUMENTS

| | | | | |
|---|---|---|---|---|
| 5,157,762 A | * | 10/1992 | Snietka ........................ 345/589 |
| 5,163,128 A | * | 11/1992 | Straayer ....................... 345/589 |
| 5,513,099 A | * | 4/1996 | Schein ......................... 700/59 |
| 5,515,293 A | * | 5/1996 | Edwards ...................... 716/11 |
| 5,608,453 A | * | 3/1997 | Gerber et al. .................. 348/87 |
| 5,691,913 A | * | 11/1997 | Tsuchida et al. ............... 716/8 |
| 5,856,925 A | * | 1/1999 | Maeda et al. ................... 716/5 |
| 5,862,973 A | | 1/1999 | Wasserman |
| 5,912,984 A | | 6/1999 | Michael et al. |
| 5,982,927 A | | 11/1999 | Koljonen |
| 6,091,996 A | * | 7/2000 | Whitehead et al. ............ 700/57 |
| D446,796 S | | 8/2001 | Rose et al. |
| 6,317,513 B2 | | 11/2001 | Michael et al. |
| 6,477,266 B1 | * | 11/2002 | Asar ........................... 382/147 |
| 6,483,937 B1 | * | 11/2002 | Samuels ...................... 382/144 |
| 6,493,858 B2 | * | 12/2002 | Solomon ...................... 716/11 |
| 6,496,270 B1 | * | 12/2002 | Kelley et al. ................ 356/602 |
| 6,516,452 B2 | * | 2/2003 | Meding ......................... 716/5 |
| 6,631,508 B1 | * | 10/2003 | Williams ........................ 716/8 |
| 6,678,874 B1 | * | 1/2004 | Jochym et al. ................ 716/11 |
| 6,701,003 B1 | * | 3/2004 | Feinstein ..................... 382/147 |
| 6,714,671 B1 | * | 3/2004 | Wakitani et al. ............. 382/149 |
| 6,738,503 B1 | * | 5/2004 | Sakaue et al. ............... 382/145 |
| 6,738,958 B2 | * | 5/2004 | Manoo ......................... 716/11 |
| 6,757,421 B1 | * | 6/2004 | Kubo ........................... 382/149 |
| 6,760,471 B1 | * | 7/2004 | Raymond ..................... 382/147 |
| 6,760,890 B2 | * | 7/2004 | Makinen ........................ 716/4 |
| 6,771,805 B1 | * | 8/2004 | Kobayashi ................... 382/147 |
| 6,771,807 B2 | * | 8/2004 | Coulombe et al. ........... 382/149 |
| 6,788,806 B2 | * | 9/2004 | Kadomatsu et al. ......... 382/147 |

* cited by examiner

*Primary Examiner*—Stacy A. Whitmore
(74) *Attorney, Agent, or Firm*—Shumaker & Sieffert, P.A.

(57) ABSTRACT

A method and apparatus for translating a Gerber data file into a data format usable by vision software through a process whereby a first Gerber data element is selected and examined to determine if the shape represented by that element intersects with any other shapes. Each shape intersecting the selected element is merged into a single data object with the selected element. This process is repeated for each element describing the printed circuit board layout. The consequence of this procedure is that complex geometries that had been represented as the intersection of many simple geometries are represented as individual data objects.

20 Claims, 6 Drawing Sheets

METHODOLOGY OF CREATING AN OBJECT DATABASE FROM A GERBER FILE

RELATED APPLICATIONS

This application claims priority of U.S. provisional application Serial No. 60/350,134, filed Jan. 17, 2002 and entitled "METHODOLOGY OF CREATING OBJECT DATABASE FROM GERBER FILE."

FIELD OF THE INVENTION

This application relates generally to an apparatus and method for converting data describing the layout of a printed circuit board into a format recognizable by vision software, and more particularly to an apparatus and method for converting data describing the layout of a printed circuit board into a format recognizable by a printed circuit board inspection system.

BACKGROUND OF THE INVENTION

Printed circuit boards are used to link various electrical components into a single compact and operable unit. The boards consist generally of a substrate upon which alternating layers of conductive shapes (such as pads or paths) and dielectric material are printed. The dielectric layers are used to electrically isolate one conductive layer of the printed circuit board from another conductive layer, except where electrical connection is desired (e.g., a via may permit electrical communication from one conductive layer of a printed circuit board to another layer).

Typically, a computer aided design (CAD) system is used to design printed circuit boards. Generally, CAD systems represent the design of printed circuit boards in a data format known as the Gerber data format. A Gerber data file describes the layout of a layer of a printed circuit board by containing coordinates describing where a shape is to be printed, what geometry the shape should take on, and where the shape should end. Notably, the Gerber data format describes complex geometries as the intersection of simple geometries. This scheme is depicted in FIG. 1.

FIG. 1 depicts a magnified view of a small portion of a printed circuit board. The portion depicted in FIG. 1 contains eight pads 100–114 arranged in a generally rectangular fashion, as might be used for connection to a simple integrated circuit containing eight pins. As can be seen from FIG. 1, each of the pads 100–114 has an elongated body with a rounded top and a rounded bottom. Rather than represent pad geometry as a single data element, per the Gerber data format, each pad would be represented as the intersection of three separate simple shapes, as shown by the blow-up of pad 114. As can be seen from the blown-up depiction of pad 114, each pad 100–114 is actually defined as the intersection of a circle 116 (forming the top of the pad), a rectangle 118 (forming the body of the pad), and another circle 120 (forming the bottom of the pad).

In the course of manufacturing printed circuit boards, the Gerber data defining a printed circuit board may be passed to an inspection system that examines each layer of the printed circuit board to determine if it has been etched correctly. One repercussion of representing complex geometries as the intersection of simple geometries is that an inspection system that makes use of Gerber data must make several passes over a complex geometry in order to determine that the geometry is correctly printed. For example, with respect to the pads 100–114 depicted in FIG. 1, an inspection device operating based upon Gerber data would have to make three passes for each pad 100–114: a first pass to look for the top circle 116, a second pass to look for the rectangular body 118, and a third pass to look for the bottom circle 120. This sort of redundancy reduces the overall efficiency of the inspection system. This same issue presents itself when inspecting solder paste printing quality during printed circuit board assembly.

Another consequence of passing Gerber data to an inspection system is that the inspection system will perform its operations in the sequence defined by the Gerber file. This means that the inspection system may examine a first geometry located in one position, and then inspect a second geometry located on the other side of the board, rather than inspecting a geometry located next to the last-inspected geometry. Such a scheme is inefficient, and reduces the overall through-put of the inspection system. This same issue presents itself when inspecting solder paste printing quality during printed circuit board assembly.

As is evident from the foregoing discussion, there exists a need for a scheme by which Gerber data may be translated into a format readable by vision software (such as may be found on a printed circuit board inspection system). A desirable solution may represent complex geometries as a single data element. Additionally, a desirable solution may order its translated data format in such a way as to prevent the inspection system from consecutively inspecting geometries situated in non-proximate regions of the board.

SUMMARY OF THE INVENTION

Against this backdrop the present embodiments have been developed. A method of converting a data set describing a layout of a printed circuit board into a format recognizable by vision software may be realized by finding a first data element representing a first shape that intersects with a second shape represented by a second data element. Next, the first and second data elements are merged. Finally, the merged element is exported as a single data element.

According to another embodiment of the invention, a computerized system for converting a data set describing a layout of a printed circuit board into a format recognizable by vision software may include a memory element that stores the data set describing the layout of the printed circuit board. A processor may be operably coupled to the memory element. The processor may be programmed to perform the following steps. First, a first data element representing a first shape that intersects with a second shape represented by a second data element is found. Then, the first and second data elements are merged. Finally, the merged element is exported as a single data element.

According to yet another embodiment of the invention, a system for converting a data set describing a layout of a printed circuit board into a format recognizable by vision software may include a memory element storing the data set describing the layout of the printed circuit board. Additionally, the system may include a means for merging data elements representing overlapping shapes.

These and various other features as well as advantages which characterize the present invention will be apparent from a reading of the following detailed description and a review of the associated drawings.

DETAILED DESCRIPTION

A Gerber data file may be translated into a data format usable by vision software through a process whereby a first Gerber data element is selected and is examined to determine if the shape represented by that element intersects with any other shapes. Each shape intersecting the selected element is merged into a single data object with the selected element. This process is repeated for each element describing the printed circuit board layout. The consequence of this procedure is that complex geometries that had been represented as the intersection of many simple geometries are represented as individual data objects.

The above-described process may be streamlined by organizing the printed circuit board into virtual regions. According to such a scheme, it is first determined in which region or regions the selected element is situated. Thus, only those regions must be searched for shapes intersecting the shape represented by the selected element. The process of searching for intersecting shapes is repeated for each data element in each region.

Figure 1:
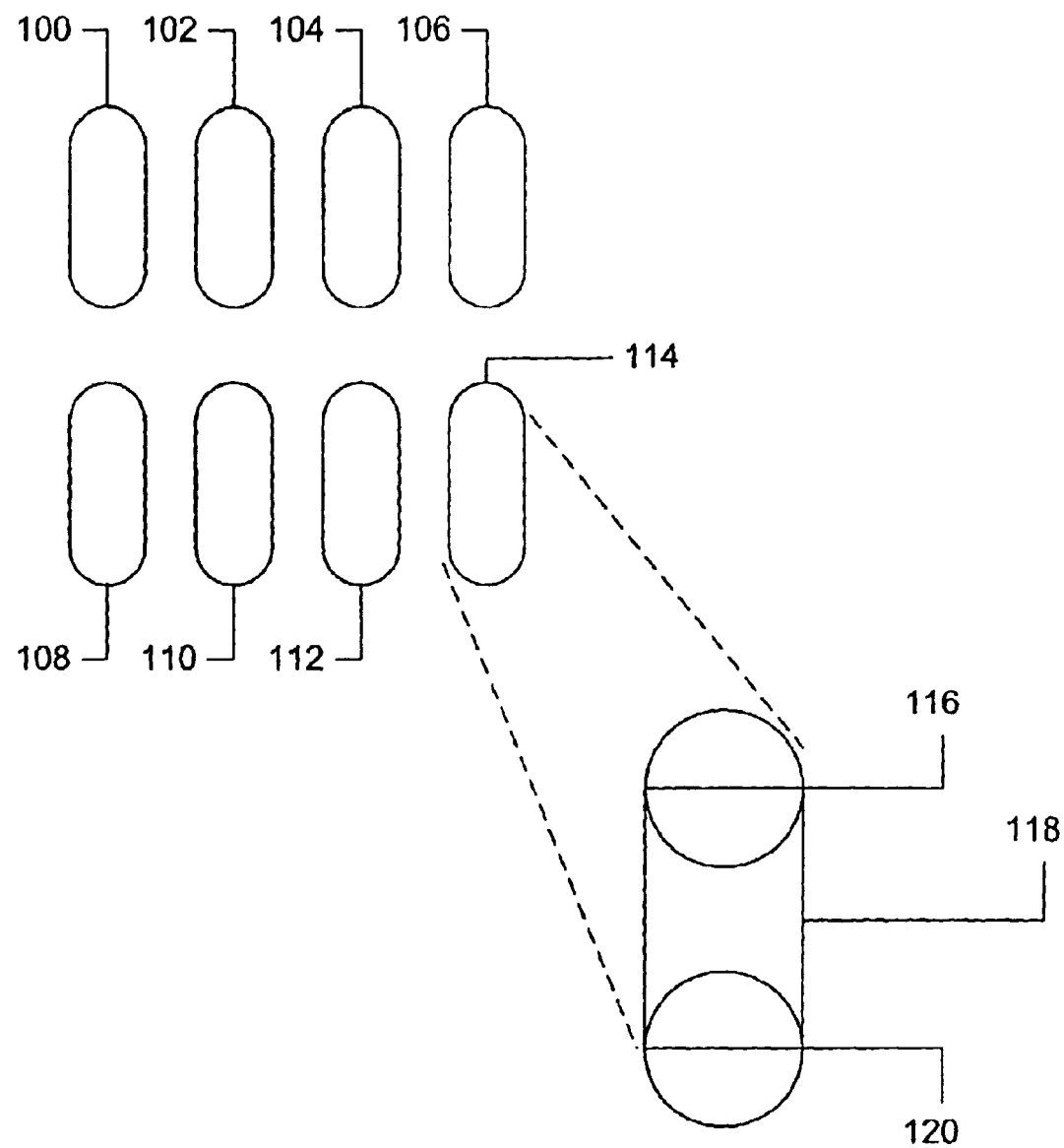
FIG. 1 depicts a portion of a printed circuit board that includes geometries described by the intersection of simple geometries.
Figure 2:
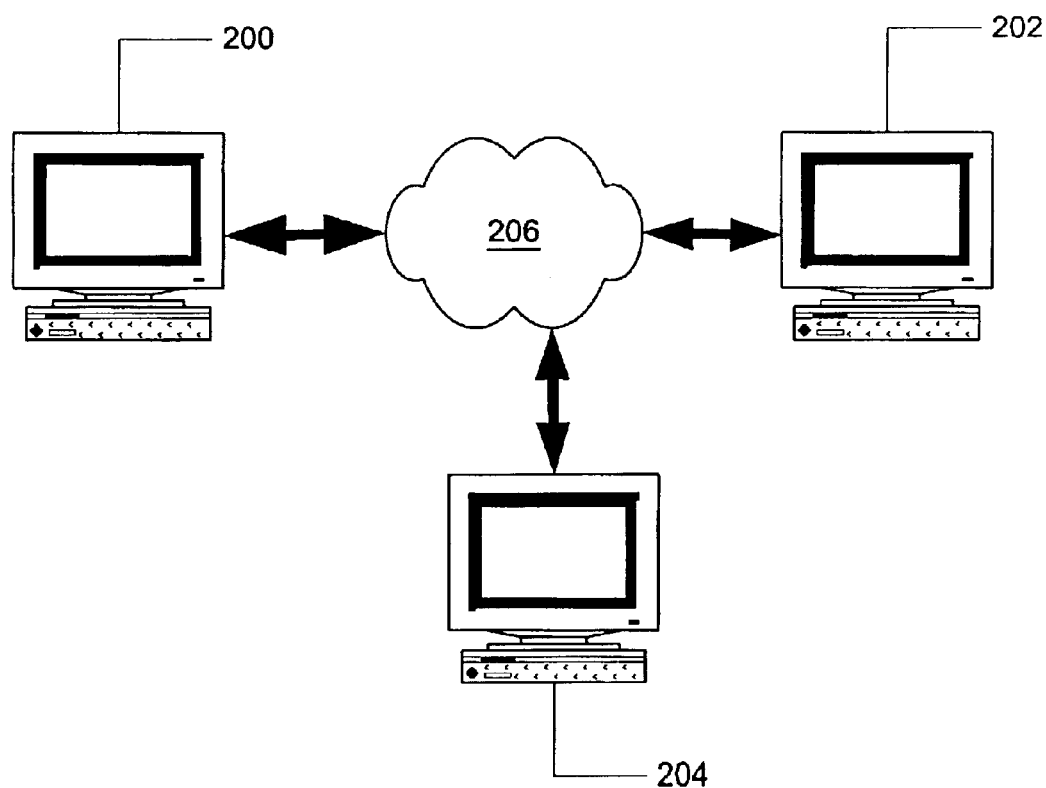
FIG. 2 depicts systems in which the schemes disclosed herein may be deployed.
Figure 3:
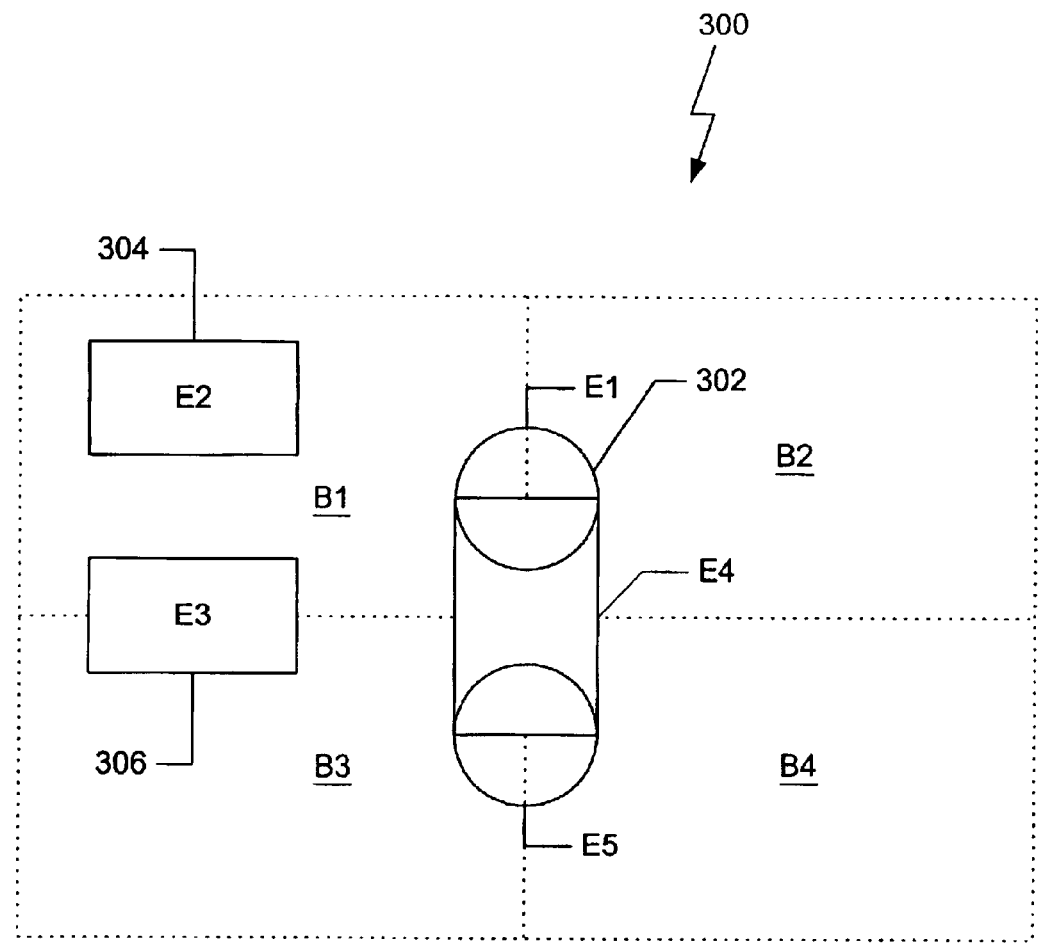
FIG. 3 depicts a portion of a printed circuit board divided into four virtual regions, each of which contains shapes represented by data elements.
Figure 4:
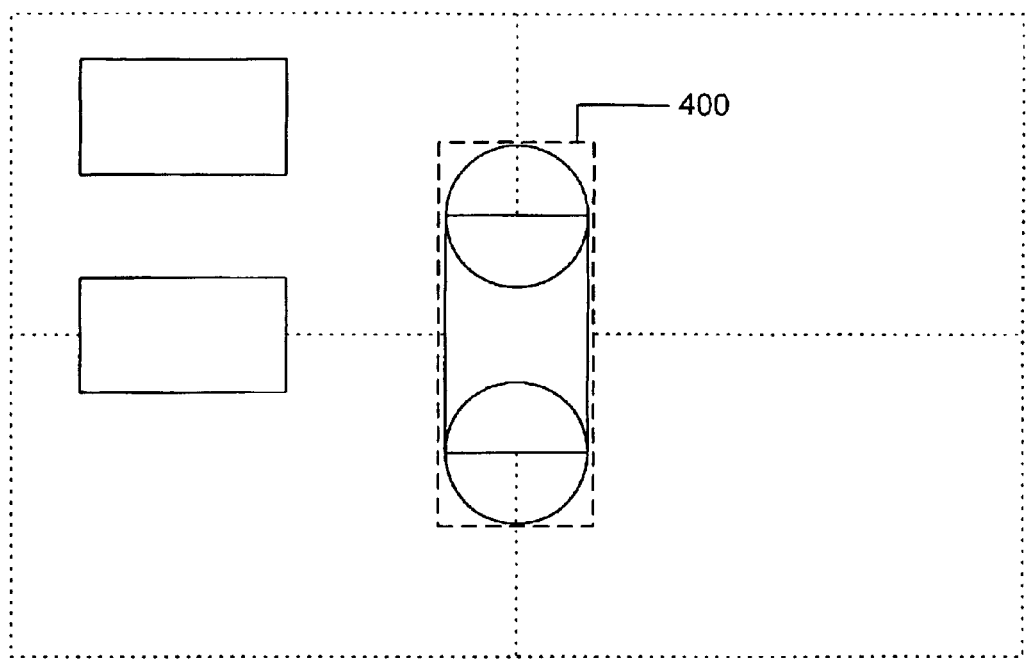
FIG. 4 depicts a complex shape bounded by a bounding rectangle.
Figure 5:
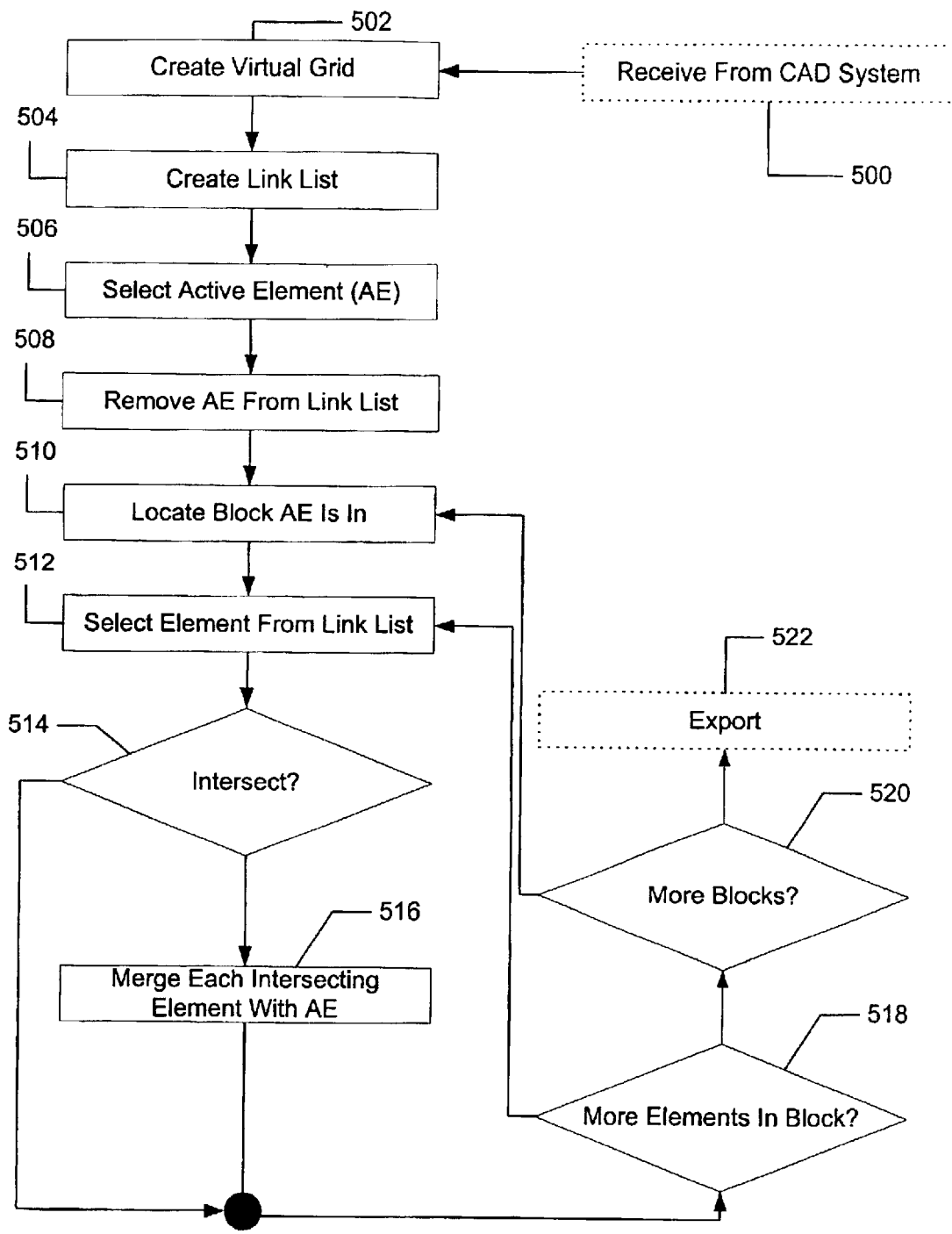
FIG. 5 depicts an operation flow, in accordance with one embodiment of the present invention.

A detailed discussion of the scheme for converting Gerber data into data usable by vision software is found in the passages related to FIGS. 3–5. The passages related to FIG. 6 disclose a scheme for organizing the converted data so as to permit an inspection system to progress in an orderly fashion as it examines a printed circuit board (rather than progressing in a haphazard, random fashion). The passage related to FIG. 2 discloses the various systems in which the methods discussed with reference to FIGS. 3–6 may be embodied.

FIG. 2 depicts a CAD system 200, and inspection system 202, and a conversion system 204, each of which is connected by a network 206 The methods disclosed herein may be embodied in software running on the CAD system 200 the inspection system 202, or any third computer system, such as a dedicated conversion system 204. Additionally, the methods disclosed herein are susceptible of deployment in any computing system.

In practice, the methods disclosed herein may be used to receive data emanating from the CAD system 200, convert such data (known as Gerber data), and export such data in a format readable by the inspection system 202. Thus, by virtue of receiving the converted data, the inspection system 202 is able to inspect the printed circuit board described by the converted data. Inspection systems (such as 202) and CAD systems (such as 200) are well known in the art, and require no discussion regarding the particulars of their construction. It is observed, however, that the CAD system 200, the inspection system 202, and the conversion system 204 each contain hardware typical of a computing environment (i.e., a processor, a memory element in cooperation with the processor, etc.). The inspection procedure performed by the inspection system 202 may include inspecting the printed circuit board for proper etching or for proper solder paste printing quality.

FIG. 3 depicts a portion of a printed circuit board 300. The portion of the circuit board 300 depicted in FIG. 3 contains three shapes 302, 304, and 306. As is indicated by FIG. 3, shape 302 is represented, in a Gerber file, by elements E1, E4, and E5. Shapes 304 and 306 are represented by elements E2 and E3, respectively.

As stated earlier, the procedure disclosed herein finds complex shapes composed of multiple intersecting shapes, and represents those shapes in a single data object (as opposed to being represented by multiple Gerber elements). For example, when operated upon by the procedure disclosed herein, shape 302 will be represented by a single data object, rather than by Gerber elements E1, E4, and E5. During discussion of the procedure, simultaneous reference will be made to the flowchart depicted in FIG. 5 and to the hypothetical portion of the printed circuit board 300 depicted in FIG. 3.

Optionally, the conversion procedure begins by receiving Gerber data from the CAD system 200, as shown in FIG. 5 by operation 500. The Gerber data may be transferred to the machine executing the conversion method by any manner (it may be transferred via a network 206, via a diskette (not pictured), via inter-task messaging, etc.). Initially, the procedure begins by dividing the printed circuit board 300 into a plurality of virtual regions, as shown by operation 502. As depicted by FIG. 3, the printed circuit board 300 has been divided into four virtual regions B1, B2, B3, and B4, which are rectangular shaped blocks that tessellate with one another. As will become evident below, the virtual regions B1, B2, B3, and B4 limit the scope of the search for intersecting shapes. Accordingly, the size, shape, and number of virtual regions into which a printed circuit board is divided is a design choice that influences the processing time required to execute the conversion method.

After creation of the virtual regions, a link list of each of the Gerber elements is created, as shown by operation 504. Thus, with reference to the exemplary printed circuit board portion 300, elements E1–E5 are entered into a link list. Thus, the link list would initially appear as follows:

E1→E2→E3→E4→E5

The link list stores a list of all Gerber elements that have not been examined to determine if the shapes they represent intersect with another shape. Thereafter, as shown by operation 506, a first element is selected from the link list; this element is termed the "active element." The active element is an element that is examined to determine if the shape it represents intersects with the shapes represented by the other elements in the link list. For the sake of illustration, assume that element E1 (which represents the circle forming the top portion of the pad 302) is selected as the active element in operation 506 Next, as shown in operation 508, the active element E1 is removed from the link list, meaning the link list appears as follows:

E2→E3→E4→E5

After the active element E1 has been removed from the link list, it is determined in which virtual regions the active element E1 is situated. In this case, the active element E1 is situated in regions B1 and B2 Per operation 510, one of the regions in which the active element E1 is situated is chosen as an inspection region. Let us assume region B1 is chosen.

Thereafter, in operation 512, an element from region B1 is selected. Let us assume element E4, which is situated partially in region B1, is selected. In operation 514 it is determined whether or not the selected element E4 intersects the active element E1. In this case, the two elements do in fact intersect, thus control is turned over to operation 516.

In operation 516, the selected element E4 and the active element E1 are merged, which means that they are associated by a link, and the selected element E4 is removed from the link list, meaning the link list appears as follows:

E2→E3→E5

Control flows to query operation 518, in which it is determined whether there are additional elements in the inspection region B1. In this case, elements E2 and E3 are each at least partially situated within the inspection region, so control returns to operation 512, whereupon one of the two elements E2 or E3 will be selected for inspection to determine whether they intersect with the active element, which is the merger of E1 and E4 By virtue of operations 512, 514 and 518, a loop is constructed which is traversed twice (once for inspection of E2 and once for the inspection of E3), during which it is determined that neither E2 nor E3 intersect with the active element.

After the inspection of elements E2 and E3, control is passed from query operation 518 (where it is determined that there are no more elements to examine in region B1) to query operation 520 In query operation 520, it is determined whether or not there are more blocks in which the active element (merged E1 and E4) is situated. In this case, the answer is in the affirmative, because the active element lies in regions B3, B4, and B2—none of which have yet been inspected. Therefore, control is passed to operation 510, in which another region containing the active element is chosen for inspection. Let us assume region B3 is selected next.

After selection of region B3 in operation 510, the flow of operation progresses as described previously with reference to operations 512–518, with the sole exception being that region B3 is inspected for shapes intersecting the active element, as opposed to region B1 being the inspection region. As a consequence of inspecting region B3, it is found that the shape represented by element E5 intersects the active element (which is the merger of E1 and E4). Thus, element E5 is merged with the active element (in operation 516), which means that it is associated with the active element by a link, and is removed from the link list. Thus, the link list appears as follows:

E2→E3

After merging element E5 with the active element in operation 516, the method will continue to traverse the above-described loops searching for: (1) additional elements in the selected inspection block (this loop is defined by operations 512, 514, 516, and 518); and (2) additional blocks in which the active element lies (this loop is defined by operations 510, 512, 514, 516, 518, and 520). Once completed, each block has been exhausted, and the method has found and merged each element that cooperates with the original active element (E1) to form a complex geometry.

Finally, in operation 522, the merged element may be exported as a single data object. The format of the exported data object will vary based upon the system to which the data object is to be exported. A typical format, however, includes a data object having three fields: (1) a description of a bounding rectangle (an example of which is identified by reference numeral 400 in FIG. 4) of the complex geometry; (2) shape of the object; and (3) size of the object as compared to the bounding rectangle 400.

Figure 6:
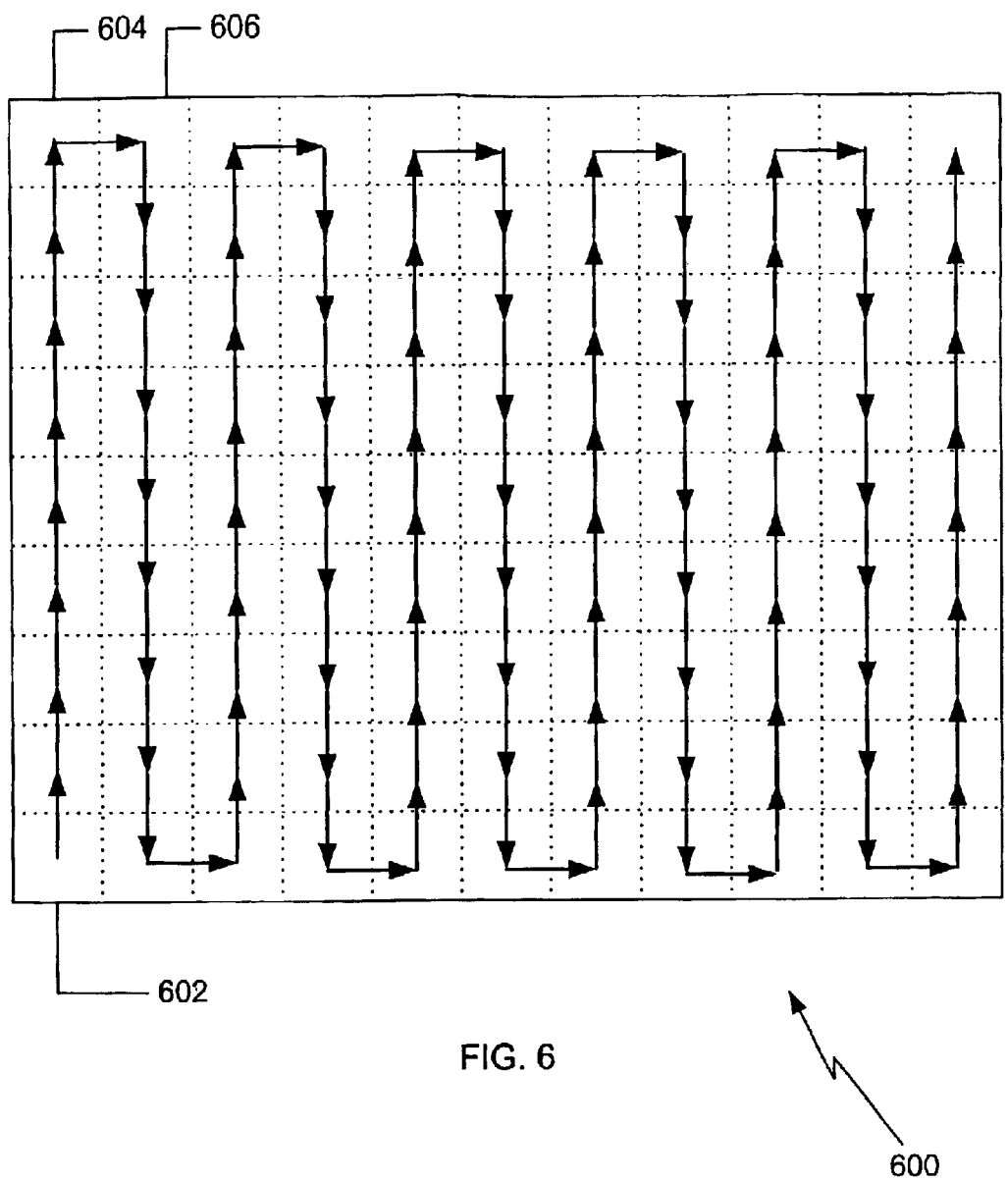
FIG. 6 depicts a printed circuit board divided into a plurality of virtual regions. The elements within each region are input into a data file on a region-by-region basis to produce an orderly inspection.

As discussed previously, another optional aspect of the scheme disclosed herein is to produce a converted data format that is not only usable by an inspection system, but is also ordered so as to allow the inspection system to proceed through a printed circuit board in an orderly manner. FIG. 6 depicts a printed circuit board 600 that has been divided into ninety-nine virtual regions. One scheme for ordering a converted data file (such as would result from use of the method depicted in FIG. 5), is to order the file so as to have elements representing shapes within a particular corner region 602 of the circuit board 600 be listed at the top of the file. Next, elements representing shapes contained in the virtual region above the corner region 602 are listed in the file. The file goes on to list elements representing shapes contained in virtual regions, based upon a region-by-region scheme, wherein each successive region is chosen to be located directly above the last region, until the top 604 of the board is encountered. When the top 604 of the board is encountered, the shapes in the adjacent region 606 are next listed. The pattern continues in a generally zigzag pattern, as depicted in FIG. 6, until the elements representing each shape are entered into the output file. Consequently, the inspection system, which progresses in the same order as the elements are listed in the file, will inspect the board 600 in an orderly fashion.

To summarize, a method of converting a data set describing a layout of a printed circuit board into a format recognizable by vision software can be accomplished by finding a first data element representing a first shape that intersects with a second shape represented by a second data element (such as is accomplished by operations 502–514) Next the first and second data elements are merged (such as is shown by operation 516). Finally, the merged element is exported as a single data element (such as in operation 522). The exported data element may be exported to an inspection system, which may use the data to perform its inspection functions. This method is especially suited for operation upon a Gerber data set. The Gerber data may be received from a printed circuit board computer aided design system (as is shown by operation 500).

The method may involve other steps, such as dividing a layer of the printed circuit board into a plurality of regions (such as in operation 502). For example, a layer of the printed circuit board may be divided into a plurality of rectangular, tessellating regions. Next, a data element may be identified as an active element (such as in operation 506). Thereafter, a region in which the shape represented by the active element is situated may be identified (such as in operation 510). Finally, within the identified region, all other shapes intersecting the shape represented by the active element may be found (such as is shown by operations 512, 514, 516, and 518).

Upon identification of intersecting shapes within an inspection region, those elements may be merged with the active element, (such as in operation 516). Thereafter, the merged data element is identified as the active element (such as in operation 516). Next, another region in which the shape represented by the active element is situated may be identified (such as is shown in operation 520). Then, within the aforementioned region, all other shapes intersecting the shape represented by the active element may be found (such as is shown by operations 510, 512, 514, 516, 518 and 520). Finally, the intersecting element may be merged (such as is shown in operation 516). The above-describe steps may be repeated until all regions in which the shape represented by the active element is situated have been identified.

A computing apparatus (such as 200, 202, or 204), which contains a processor and a memory element, may be programmed to implement the above-describe methods.

It will be clear that the present invention is well adapted to attain the ends and advantages mentioned as well as those inherent therein. While a presently preferred embodiment has been described for purposes of this disclosure, various changes and modifications may be made which are well within the scope of the present invention. For example, a printed circuit board may be divided into virtual regions of any shape and in any number. Additionally, other methods of ordering the converted data file to produce an orderly, efficient inspection may be utilized. For example, the file may be ordered so that each successive element in the file is chosen so that it represents a shape that is the shortest distance from the shape represented by the preceding element. Furthermore, other hardware arrangements may be used to implement the data conversion methods disclosed herein. Numerous other changes may be made which will readily suggest themselves to those skilled in the art and which are encompassed in the invention disclosed and as defined in the appended claims.

What is claimed is:

1. A method of converting a data set describing a printed circuit board into a format recognizable by vision software, the data set comprising data elements representing various shapes, some of which overlap thereby forming a continuous composite shape, the method comprising:
   (a) finding a first data element representing a first shape that intersects with a second shape represented by a second data element;
   (b) merging the first and second data elements; and
   (c) exporting the merged element as a single data elements,
   wherein the step (a) further comprises:
      (a)(i) dividing a layer of the printed circuit board into a plurality of regions:
      (a)(ii) identifying one data element as an active element:
      (a)(iii) identifying a region in which the shape represented by the active element is situated; and
      (a)(iv) within the identified region, finding all other shapes intersecting the shape represented by the active element.

2. The method of claim 1, further comprising:
   (a)(v) merging the data elements found in step (a)(iv);
   (a)(vi) identifying the merged data element as the active element;
   (a)(vii) identifying another region in which the shape represented by the active element is situated; and
   (a)(viii) within the region identified in step (a)(vii), finding all other shapes intersecting the shape represented by the active element; and
   (a)(ix) merging the data elements found in step (a)(viii).

3. The method of claim 2, further comprising:
   (a)(x) repeating steps (a)(vi) through (a)(ix) until all regions in which the shape represented by the active element is situated have been identified.

4. The method of claim 1, wherein step (a)(i) further comprises dividing a layer of the printed circuit board into a plurality of rectangular, tessellating regions.

5. The method of claim 1, wherein the data set representing the layout of the printed circuit board is a Gerber data set.

6. The method of claim 1, wherein step (a) is preceded by the step of:
   receiving the data set describing the printed circuit board from a printed circuit board computer aided design system.

7. The method of claim 1, wherein step (c) is followed by the step of: sending the exported data to a printed circuit board inspection system.

8. The method of claim 1, wherein step (c) is followed by the step of:
   inspecting a layer of a printed circuit board using the exported data.

9. A computerized system for converting a data set describing a printed circuit board into a format recognizable by vision software, the data set comprising data elements representing various shapes, some of which overlap thereby forming a continuous composite shape, the system comprising:
   a memory element that stores the data set describing the layout of the printed circuit board; and
   a processor operably coupled to the memory element and programmed to perform the following steps:
      (a) finding a first data element representing a first shape that intersects with a second shape represented by a second data element;
      (b) merging the first and second data elements; and
      (c) exporting the merged element as a single data element,
   wherein the processor is further programmed to perform step (a) by performing the following additional steps:
      (a)(i) dividing a layer of the printed circuit board into a plurality of regions;
      (a)(ii) identifying one data element as an active element;
      (a)(iii) identifying a region in which the shape represented by the active element is situated; and
      (a)(iv) within the identified region, finding all other shapes intersecting the shape represented by the active element.

10. The computerized system of claim 9, wherein the processor is further programmed to perform the following steps:
   (a)(v) merging the data elements found in step (a)(iv);
   (a)(vi) identifying the merged data element as the active element;
   (a)(vii) identifying another region in which the shape represented by the active element is situated; and
   (a)(viii) within the region identified in step (a)(vii), finding all other shapes intersecting the shape represented by the active element; and
   (a)(ix) merging the data elements found in step (a)(viii).

11. The computerized system of claim 10, the processor is further programmed to perform the following step:
   (a)(x) repeating steps (a)(vi) through (a)(ix) until all regions in which the shape represented by the active element is situated have been identified.

12. The computerized system of claim 9, wherein the processor is programmed to perform step (a)(i) by dividing a layer of the printed circuit board into a plurality of rectangular, tessellating regions.

13. The computerized system of claim 9, wherein the data set stored in the memory element is a Gerber data set.

14. The computerized system of claim 9, wherein the processor is further programmed to receive the data set describing the printed circuit board from a printed circuit board computer aided design system.

15. The computerized system of claim 9, wherein the processor is further programmed to send the exported data to a printed circuit board inspection system.

16. A system for converting a data set describing a printed circuit board into a format recognizable by vision software, the data set comprising data elements representing various shapes, some of which overlap thereby forming a continuous composite shape, the system comprising:

- a memory element storing the data set describing the layout of the printed circuit board; and
- a means for merging data elements representing overlapping shapes, wherein the means for merging data elements comprises a means for:
  - (a)(i) dividing a layer of the printed circuit board into a plurality of regions;
  - (a)(ii) identifying one data element as an active element;
  - (a)(iii) identifying a region in which the shape represented by the active element is situated; and
  - (a)(iv) within the identified region, finding all other shapes intersecting the shape represented by the active element.

17. The system of claim 16, wherein the means for merging data elements further comprises:

- a means for merging data elements representing overlapping shapes situated in one of the plurality of regions.

18. The system of claim 16, wherein the means for merging data elements is embodied within a printed circuit board computer aided design system.

19. The system of claim 16, wherein the means for merging data elements is embodied within a printed circuit board inspection system.

20. The system of claim 16, comprising a means for exporting the merged data elements to a printed circuit board inspection system.

* * * * *